US007301484B2

(12) United States Patent  
Hertz

(10) Patent No.: US 7,301,484 B2
(45) Date of Patent: Nov. 27, 2007

(54) DATA DECODER

(75) Inventor: Michael G Hertz, Washington Township, MI (US)

(73) Assignee: Lecroy Corporation, Chestnut Ridge, NY (US)

( * ) Notice: Subject to any disclaimer, the term of this patent is extended or adjusted under 35 U.S.C. 154(b) by 52 days.

(21) Appl. No.: 11/264,396

(22) Filed: Nov. 1, 2005

(65) Prior Publication Data

US 2007/0096951 A1    May 3, 2007

(51) Int. Cl.
*H03M 5/04* (2006.01)
(52) U.S. Cl. ..................................... 341/68; 702/67
(58) Field of Classification Search ............... 341/68, 341/69; 702/67, 68, 71
See application file for complete search history.

(56) References Cited

U.S. PATENT DOCUMENTS

| 4,194,185 A | * | 3/1980 | Wilson ...................... 341/161 |
| 4,425,643 A | | 1/1984 | Chapman et al. |
| 4,445,192 A | * | 4/1984 | Haag et al. ................. 345/418 |
| 4,608,652 A | * | 8/1986 | Yokokawa et al. ........... 341/76 |
| 4,944,299 A | * | 7/1990 | Silvian ........................ 607/32 |
| 4,977,514 A | * | 12/1990 | Bush ........................... 702/67 |
| 5,446,650 A | * | 8/1995 | Overhage et al. ............. 702/68 |
| 5,825,825 A | * | 10/1998 | Altmann et al. ............ 375/293 |
| 5,854,996 A | | 12/1998 | Overhage et al. |
| 6,507,294 B1 | * | 1/2003 | King ........................... 341/68 |
| 6,847,349 B2 | | 1/2005 | Azinger |
| 2005/0175079 A1 | | 8/2005 | Gamper et al. |
| 2005/0273285 A1 | * | 12/2005 | Onu ............................. 702/67 |
| 2007/0032977 A1 | * | 2/2007 | Kaval et al. ................ 702/124 |

FOREIGN PATENT DOCUMENTS

JP           5546579 B2 * 11/1980

* cited by examiner

Primary Examiner—Howard L. Williams
(74) Attorney, Agent, or Firm—Gordon Kessler

(57) ABSTRACT

A method, apparatus and computer program for decoding a data stream. The method comprises the steps of acquiring an analog data signal, determining an initial polarity of the analog data signal, determining a threshold transition level, determining a plurality of transition edges where the analog data signal crosses the threshold transition level, and determining the number of unit intervals between each pair of transition edges. A binary value is assigned to each of the unit intervals, and the binary values are displayed to a user.

21 Claims, 4 Drawing Sheets

DATA DECODER

BACKGROUND OF THE INVENTION

The present invention relates generally to time domain measurement instruments, such as an oscilloscope, and more particularly to such an instrument that is able to decode and interpret an input waveform to determine a data sequence represented thereby, such as a Non-Return to Zero (NRZ) data sequence.

Oscilloscopes acquire and display a representation of a received analog waveform. These analog waveforms often are representative of a transmitted digital signal. While apparatuses exist for defining a particular protocol, and decoding the digital signal represented by the analog waveform, they rely on various aspects of the digital protocol to define the interpretation.

SUMMARY OF THE INVENTION

In accordance with the present invention, a method and apparatus are provided for determining and displaying a digital bit sequence represented by a generic analog waveform. The invention particularly removes the need for a protocol definition, or other external synchronization tools, such as a tracking PLL, for interpretation. Rather, a received analog waveform is analyzed, transitions through a threshold are determined, and a digital bit stream extracted from the analog waveform is provided.

It is therefore an object of the invention to provide a new data decoder that improves over currently available devices.

Still other objects and advantages of the invention will in part be obvious and will in part be apparent from the specification and the drawings.

The invention accordingly comprises the several steps and the relation of one or more of such steps with respect to each of the others, and the apparatus embodying features of construction, combination(s) of elements and arrangement of parts that are adapted to affect such steps, all as exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

The invention will now be described, making reference to the accompanying drawings.

Figure 1:
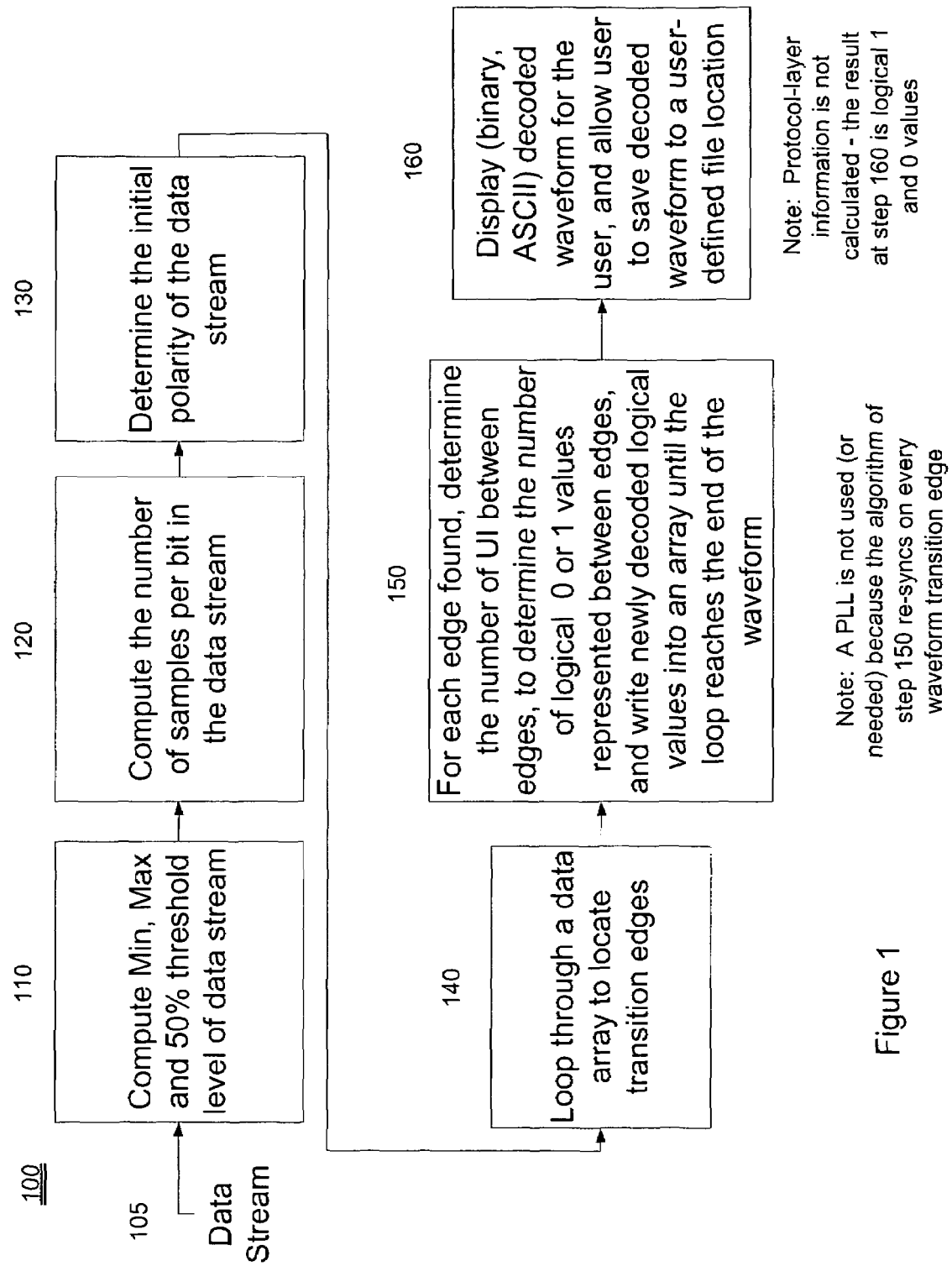
FIG. 1 flow chart diagram depicting steps in accordance with the invention.

Referring first to FIG. 1, a flowchart 100 depicting the steps of an embodiment of the invention is shown. A data stream 100 is acquired by an acquisition portion of an oscilloscope. Thereafter, a processor portion of the oscilloscope computes the minimum, maximum and 50% threshold level of the data stream at step 110. Thus, the oscilloscope determines the range of values in the data stream, and a mean value (between the minimum and maximum values) to be used as a threshold for transition of the data signal.

Next, at step 120, the processor also computes the number of samples per bit in the data stream. Alternatively, as will be described below, the user is able to manually enter the desired bitrate. Furthermore, the processor also determines the initial polarity of the data stream so that the algorithm can determine when a transition period is reached, in which direction the transition is taking place (i.e. from a logic "0" to a logic "1", or in the other direction).

After these preliminary steps have been performed, the processor reviews or loops through the data stream (data array, as the data stream is now stored in memory in the oscilloscope) to determine the location of transition edges at step 140. These transition edges comprise portions of the data stream where the signal crosses the 50% threshold level determined in the above description. Once these transition edges have been located, it is necessary to further compute the time during which the signal remained either above or below the transition (time between adjacent transition edges). Therefore, at step 150, for each located transition edge, the number of unit intervals (value corresponding to a single data value) before the next transition edges is computed. Thus, if it is determined that the signal has transitioned to a "1" logic level, and five unit intervals pass before transitioning back to a "0" logic level, the processor determines that the data stream at the portion represents 5 consecutive bits of data that are all at a "1" logic level. These values are written into a data array for storage until all of the desired data in the waveform is decoded. It should be noted that this decoding in accordance with the invention does not require the use of a Phase Locked Loop (PLL) because the process is re-synchronized at every waveform transition edge.

After the desired portion of the waveform has been decoded, the stream of binary values is displayed to the user. There is no need to perform a protocol layer comparison or the like. A stream of "1" and "0" logical values is shown to the user without reference to any particular protocol definition. In accordance with an embodiment of the invention, if a user views a particular portion of the input waveform on the display, a corresponding portion of the binary information may be displayed. In an alternative embodiment, if a user selects one or more of these binary values, a corresponding portion of the stored input waveform may be displayed. Alternatively, a cursor or other indicator may be employed to indicate the portion of the analog waveform corresponding to the selected binary values.

Figure 2:
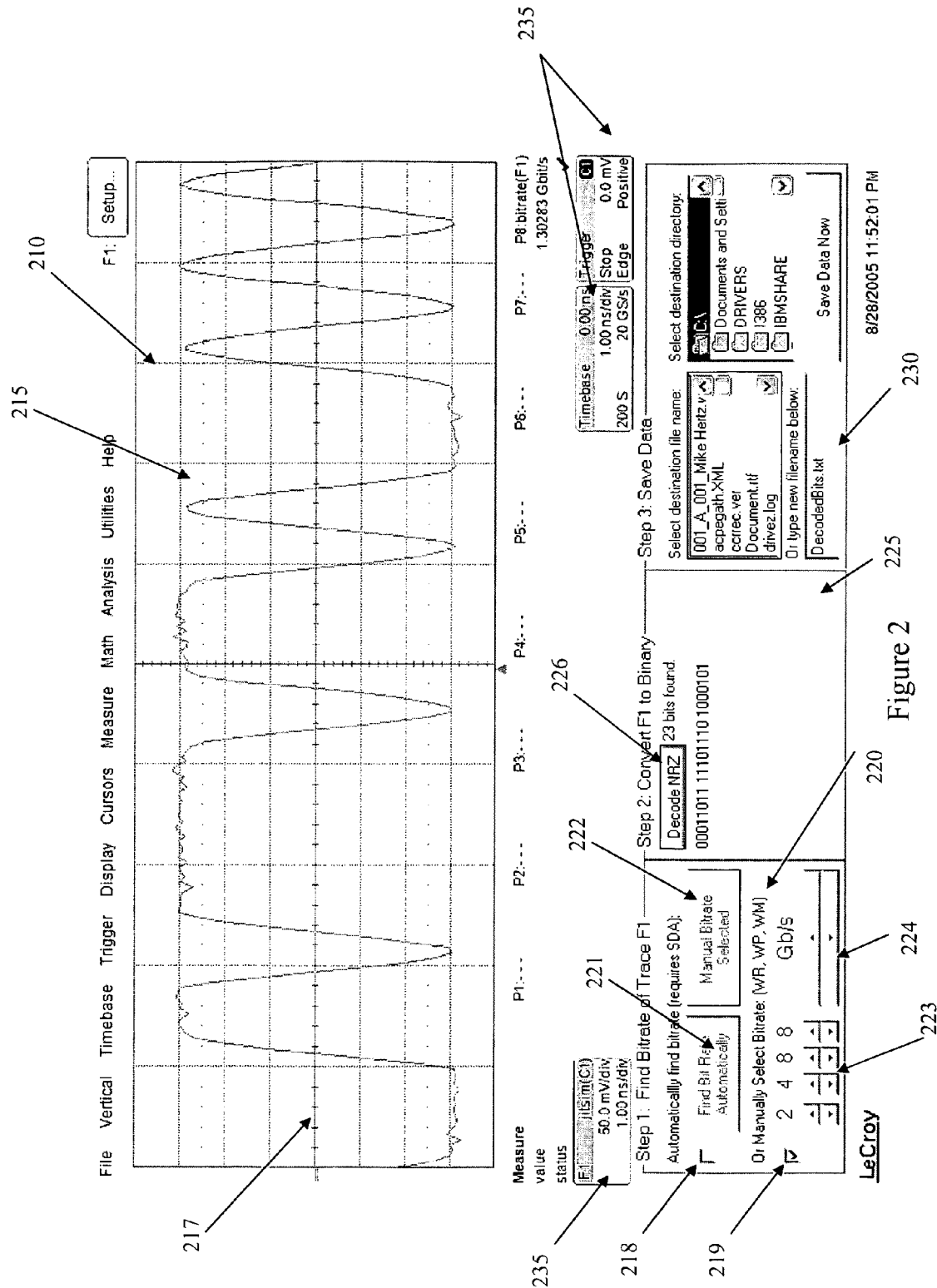
FIG. 2 is a screen image depicting a first embodiment of the invention.

Referring next to FIG. 2, a screen image from an oscilloscope display depicting an embodiment of the invention is shown. In FIG. 2, a display 210 shows a waveform 215. Waveform 215 is shown transitioning about a central transition line 217. As noted above with respect to FIG. 1, this central transition line is determined by calculating the Min, Max and 50% threshold level of the data stream. This 50% threshold level is preferably scaled to be shown at approximately the center of the display along the vertical axis. Also shown in FIG. 2 are a number of data blocks 235 depicting various settings of the oscilloscope, such as timebase information, trigger settings, and display parameters.

A bitrate menu 220 is shown, which allows a user to select between allowing the oscilloscope to determine the bitrate of signal 215 (by enabling checkbox 218, thus selecting the "Find Bit Rate Automatically" mode, and whose instantaneous bitrate can be updated using control 221) and manually setting the bitrate (by enabling checkbox 219, thus selecting the "Manual Bitrate Selected" mode, whose bitrate value is displayed by indicator 222). In FIG. 2, checkbox 219 has been selected and indicator 222 indicates the manual bitrate selection mode. Therefore a user is able to select the bitrate through the use of numerical up/down selector switches for bitrate value (223) and bitrate order of magnitude (224).

After these settings have been determined, processing takes place as noted above, and the oscilloscope computes and displays the information shown in menu 225. Thus, upon selection of "Decode NRZ" button 226, the algorithm determines the number of bits in the input data stream (227) and displays the decoded binary values (228). As noted above, the binary data may be correlated with the displayed waveform, and thus, scrolling of the waveform will result in a re-calculated set of binary decoded values each time that Decode NRZ (226) is pressed. In a preferred embodiment, if the waveform contains 256 bits or less, then the NRZ decoder output displays the entire decoded waveform on the interface. If the waveform contains greater than 256 bits, then the NRZ decoder displays the first 256 bits on the interface. All of the bits, however, have been decoded, and the resultant saved binary decoded trace saves all of the decoded binary values (e.g. thousands of bits) into the designated output file.

After the binary data has been determined, the user is provided the option to store the data, such as the waveform, binary data and various oscilloscope settings, to a data file. The storage of data to a storage device is well known to one of ordinary skill in the art. By storing the data, the user is able to recall the information, placing the oscilloscope in the same state as if it had just acquired the data stream and determined the binary bit sequence.

Figure 3:
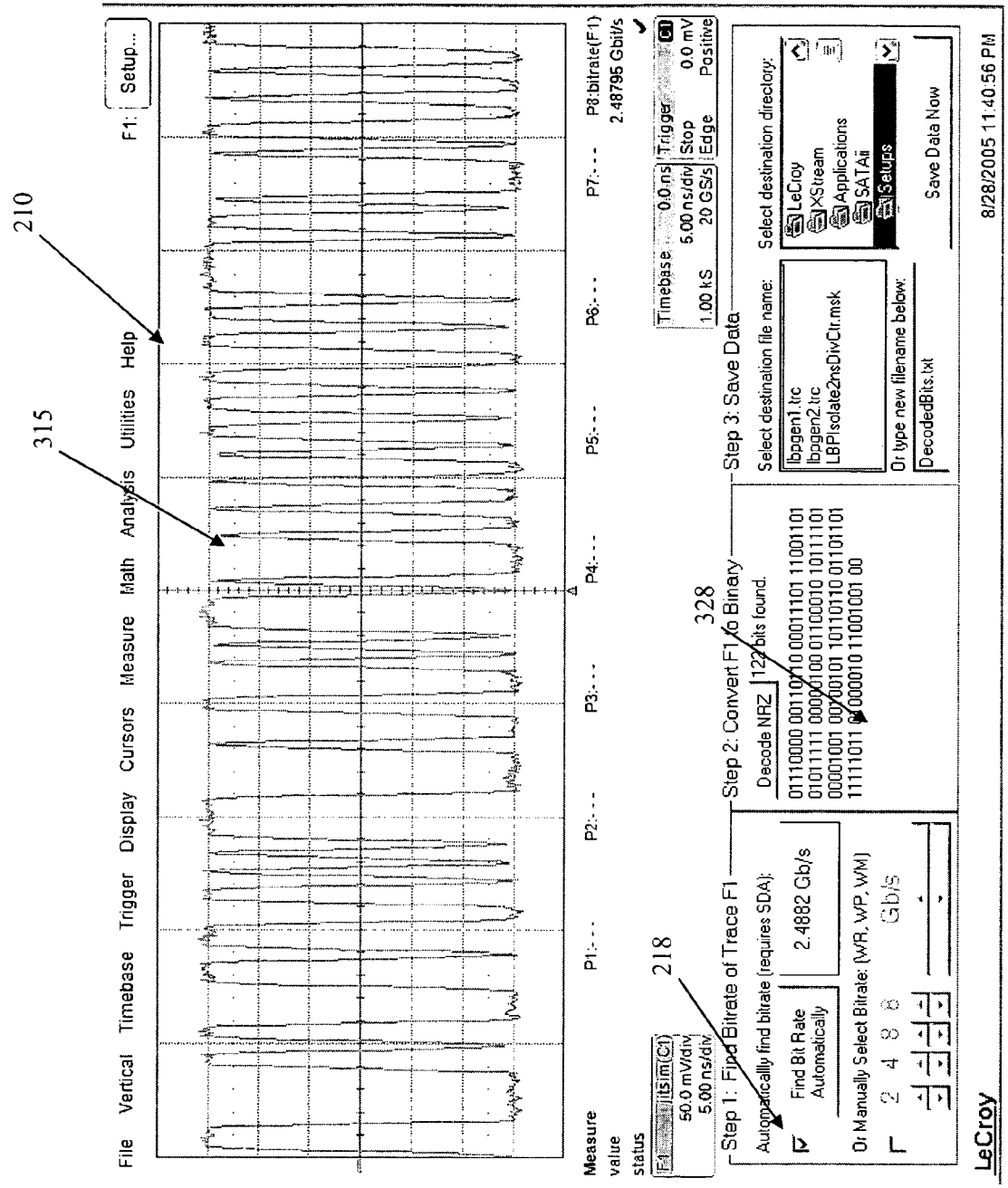
FIG. 3 is a screen image depicting a second embodiment of the invention.

Referring next to FIG. 3, a similar screen image to that of FIG. 2 is shown. However, the display of FIG. 3 includes automatic determination of bitrate, and a larger amount of the acquired waveform on the display. Thus, as is shown, display 210 includes a waveform 315. "Find Bit Rate Automatically" checkbox 218 has been selected. Thus rather than manually selecting the bitrate, it is determined automatically by the oscilloscope, using a standard bitrate measurement parameter.

As is evident in the figure, and as was noted above, more of the waveform 315 is shown on display 210. Correspondingly, more binary values 328 are shown. These binary values represent data for the portion of the waveform shown in the display.

Figure 4:
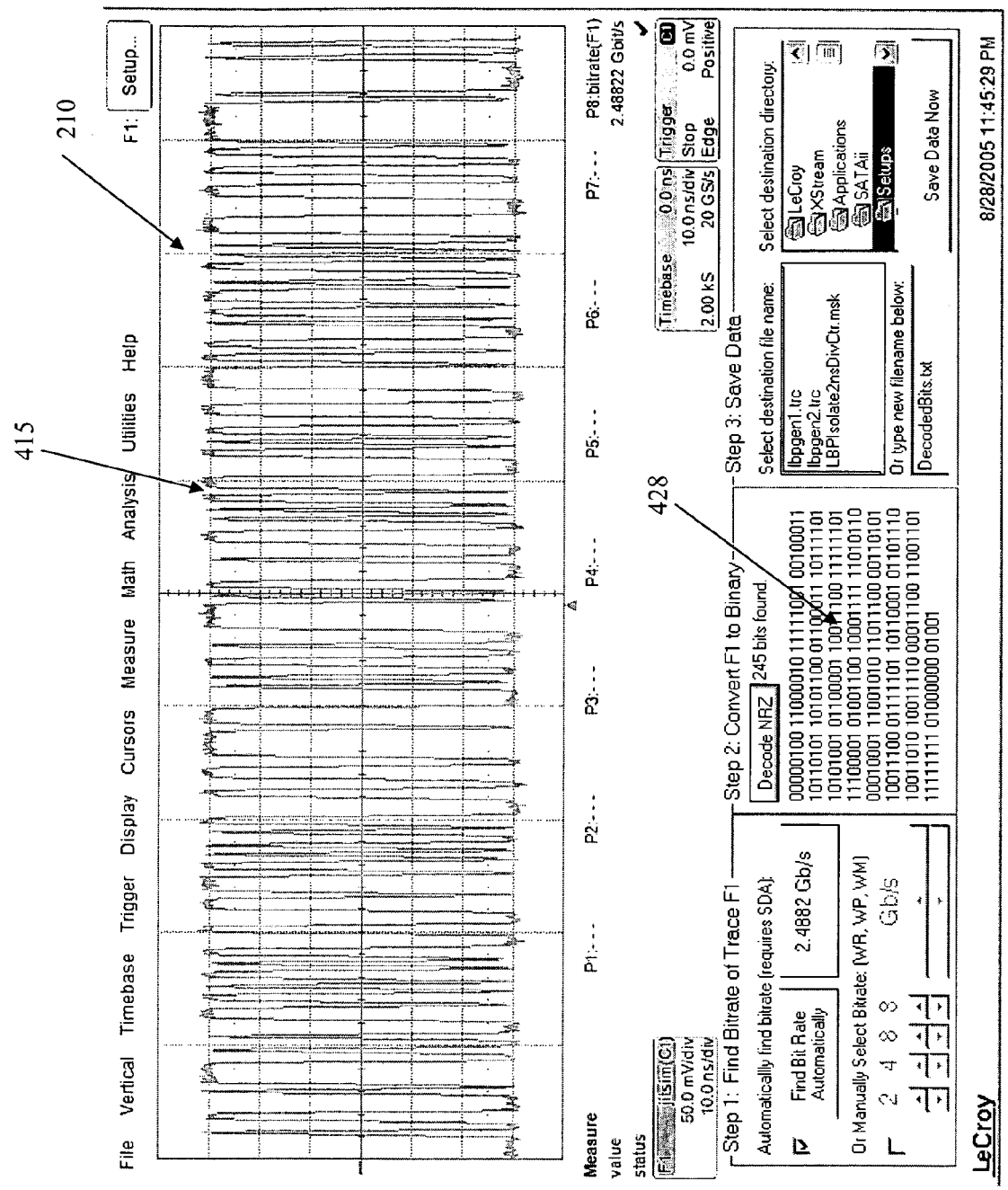
FIG. 4 is a screen image depicting a third embodiment of the invention.

Referring next to FIG. 4, a screen image similar to that of FIG. 3 is shown, but including even more of a waveform 415 on display 210, and therefore correspondingly more binary data 428. Thus, by changing the scale along the horizontal axis, more or less of the waveform 415, and therefore more or less of binary data 428 can be displayed.

While the invention has been described as receiving an NRZ signal, in an alternative embodiment of the invention a PRML, partial response, or other multi-level signal may first be acquired, and converted to an NRZ signal. This generated NRZ signal may then be treated in accordance with the invention as if it had been the initially acquired signal.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall there between.

What is claimed:

1. A method for decoding a data stream, comprising the steps of:
   acquiring an analog data signal;
   determining an initial polarity of the analog data signal;
   determining a threshold transition level;
   determining a plurality of transition edges where the analog data signal crosses the threshold transition level;
   determining a polarity of the analog data signal at each transition edge in accordance with the initial polarity of the analog data signal;
   determining bitrate information of the analog data signal;
   determining the number of unit intervals between each pair of transition edges;
   assigning a binary value to each of the unit intervals; and
   storing the binary values to a computer readable storage medium.

2. The method of claim 1, further comprising the step of automatically determining the bitrate of the analog data signal.

3. The method of claim 1, wherein the step of determining bitrate information of the analog data signal comprises the step of receiving a user input designating the bitrate of the analog data signal.

4. The method of claim 1, wherein the displayed binary values correspond to a portion of the analog data signal shown on a display.

5. The method of claim 1, wherein the step of determining the threshold transition level comprises the steps of:
   determining a minimum value of the analog data signal;
   determining a maximum value of the analog data signal; and
   setting the threshold transition level midway between the minimum and maximum values.

6. The method of claim 1, wherein the analog data signal is a Non-Return to Zero (NRZ) signal.

7. The method of claim 1, wherein the analog data signal is a Non-Return to Zero (NRZ) signal that has been converted from another format.

8. A computer readable storage medium bearing instructions that when executed by a computer controlled oscllioscope for decoding a data stream, cause the oscilloscope to execute the steps of:
   acquiring an analog data signal;
   determining an initial polarity of the analog data signal;
   determining a threshold transition level;
   determining a plurality of transition edges where the analog data signal crosses the threshold transition level;
   determining a polarity of the analog data signal at each transition edge in accordance with the initial polarity of the analog data signal;
   determining bitrate information of the analog data signal;
   determining the number of unit intervals between each pair of transition edges;
   assigning a binary value to each of the unit intervals; and
   storing the binary values to a computer readable storage medium.

9. The instructions of claim 8, wherein the step of determining bitrate information of the analog data signal comprises automatically determining the bitrate of the analog data signal.

10. The instructions of claim 8, wherein the step of determining bitrate information of the analog data signal comprises receiving a user input designating the bitrate of the analog data signal.

11. The instructions of claim 8, wherein the displayed binary values correspond to a portion of the analog data signal shown on a display.

12. The instructions of claim 8, wherein the step for determining the threshold transition level comprises the further steps of:

determining a minimum value of the analog data signal;
   determining a maximum value of the analog data signal; and
   setting the threshold transition level midway between the minimum and maximum values.

13. The instructions of claim 8, wherein the analog data signal is a Non-Return to Zero (NRZ) signal.

14. The instructions of claim 8, wherein the analog data signal is a Non-Return to Zero (NRZ) signal that has been converted from another format.

15. An oscilloscope for decoding a data stream, comprising:

an acquisition portion for acquiring an analog data signal;
   a processor for determining an initial polarity of the analog data signal, determining a threshold transition level, determining a plurality of transition edges where the analog data signal crosses the threshold transition level, determining a polarity of the analog data signal at each transition edge in accordance with the initial polarity of the analog data signal, determining bitrate information of the analog data signal, determining the number of unit intervals between each pair of transition edges, and assigning a binary value to each of the unit intervals; and
   a display for displaying the binary values.

16. The oscilloscope of claim 15, wherein the processor further automatically determines the bitrate of the analog data signal.

17. The oscilloscope of claim 15, wherein the determining of the bitrate of the analog information signal comprises receiving a user input designating the bitrate of the analog data signal.

18. The oscilloscope of claim 15, wherein the display displays binary values corresponding to a portion of the analog data signal shown on the display.

19. The oscilloscope of claim 15, wherein the processor determines the threshold transition level by:

determining a minimum value of the analog data signal;
   determining a maximum value of the analog data signal; and
   setting the threshold transition level midway between the minimum and maximum values.

20. The oscilloscope of claim 15, wherein the analog data signal is a Non-Return to Zero (NRZ) signal.

21. A method for determining a polarity of an acquired analog data signal, comprising the steps of:

determining an initial polarity of the analog data signal;
   determining a threshold transition level;
   determining a plurality of transition edges where the analog data signal crosses the threshold transition level; and
   determining a polarity of the analog data signal at each transition edge in accordance with the initial polarity of the analog data signal.

* * * * *